United States Patent [19]

Mitsui et al.

[11] Patent Number: 4,560,932
[45] Date of Patent: Dec. 24, 1985

[54] MAGNETO-OPTICAL CONVERTER UTILIZING FARADAY EFFECT

[75] Inventors: Tsutomu Mitsui; Konji Tada; Yoshiki Kuhara; Masami Tatsumi, all of Osaka, Japan

[73] Assignee: Sumitomo Electric Industries, Ltd., Osaka, Japan

[21] Appl. No.: 462,177

[22] Filed: Jan. 31, 1983

[30] Foreign Application Priority Data

Jan. 29, 1982 [JP] Japan .................. 57-13786

[51] Int. Cl.$^4$ .......................... G01R 33/032
[52] U.S. Cl. ..................... 324/244; 324/96; 250/231 R; 350/376
[58] Field of Search .......... 324/244, 96, 246, 249, 324/250, 262, 302; 250/225, 231 R; 350/376

[56] References Cited

U.S. PATENT DOCUMENTS

| | | | |
|---|---|---|---|
| 3,324,393 | 6/1967 | Casey et al. | 324/96 |
| 3,466,541 | 9/1969 | Bernard et al. | 250/225 X |
| 3,537,080 | 10/1970 | Vorie et al. | 250/225 X |
| 3,621,390 | 11/1971 | Von Willisen | 324/244 X |
| 3,707,321 | 12/1972 | Jaecklin et al. | 324/96 X |
| 3,708,747 | 1/1973 | Lesueur | 324/96 |
| 3,938,639 | 2/1976 | Hermstein et al. | 324/96 |
| 3,980,949 | 9/1976 | Feldtkeller | 350/376 X |
| 4,002,975 | 1/1977 | Erickson et al. | 324/96 |
| 4,269,483 | 5/1981 | Feldtkeller | 324/96 X |
| 4,428,017 | 1/1984 | Vaerewyck et al. | 250/225 X |

*Primary Examiner*—Gerard R. Strecker
*Assistant Examiner*—Warren S. Edmonds
*Attorney, Agent, or Firm*—Sughrue, Mion, Zinn, Macpeak & Seas

[57] ABSTRACT

A magneto-optical converter utilizing the Faraday effect is disposed between the opposed ends of an iron core having a magnetic field extending therebetween. The magneto-optical converter is comprised of a body of material exhibiting the Faraday effect which is provided with a light receiving surface and a light exiting surface. A polarizer in the form of a polarizing beam splitter is located adjacent the light receiving surface whereby an incident beam of light perpendicular to the magnetic field will be deflected and polarized at right angles to the incident beam of light and directed into the receiving surface of the body of material. An analyzer comprised of a polarizing beam splitter is located adjacent the light exiting surface whereby the beam of light from the body of material will be deflected and polarized and exit the analyzer at right angles to the magnetic field. The receiving and exiting surfaces of the body material may be bevelled and optical rotators may be disposed intermediate the bevelled surfaces and the polarizer and the analyzer respectively.

10 Claims, 11 Drawing Figures

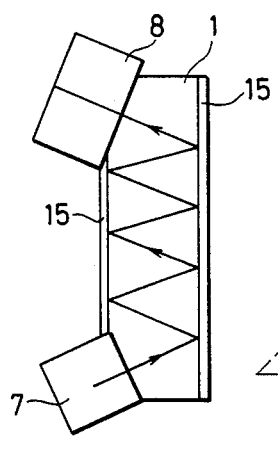
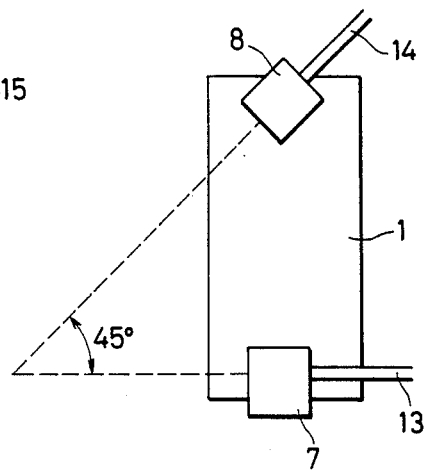
FIG. 6(a)  FIG. 6(b)
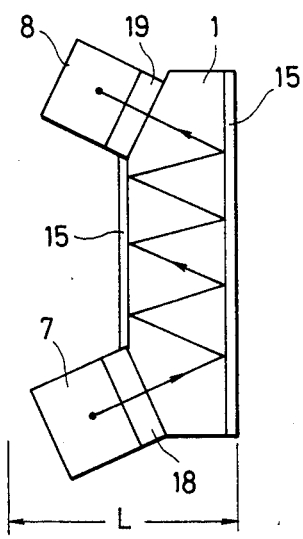
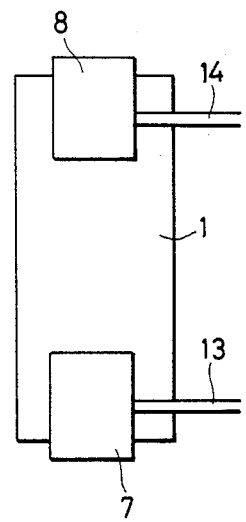
FIG. 7(a)  FIG. 7(b)

MAGNETO-OPTICAL CONVERTER UTILIZING FARADAY EFFECT

FIELD OF THE INVENTION

The present invention relates to a device for measuring the intensity of a magnetic field by the Faraday effect.

BACKGROUND OF THE INVENTION

As schematically shown in FIG. 1, the Faraday effect is the rotation of the plane of polarization that occurs when a beam of light whose plane is polarized in the y direction passes through a certain optical material (having a length l) in a direction parallel to the lines of force of a magnetic field H. By this effect, the plane of rotation of the light is rotated by an angle $\theta$ which is proportional to H and l and represented by $$\theta = V_e l H \quad (1)$$

wherein $V_e$ is the Verdet constant.

As shown in FIG. 2, a beam of light from a light source 6 is linearly polarized by a polarizer 7 and is passed through an optical material 1 and an analyzer 8 that sense a change in the intensity of light due to the change in the direction of plane polarization, and subsequently, the detected change in light intensity is converted to an electrical signal $V_{out}$ by a photo detector 9. If the polarizer is positioned at an angle of 45° with respect to the analyzer 8, the output of the resulting electrical signal $V_{out}$ is indicated by the formula:

$$V_{out} = \tfrac{1}{2} K (1 + \sin 2\theta) \quad (2)$$

wherein K is a constant determined by the intensity of incident light and the sensitivity of the photo detector 9. The increment in $V_{out}$ due to the application of a magnetic field is represented by $$V_{out} = \tfrac{1}{2} K \sin 2\theta \cong \tfrac{1}{2} K \cdot 2\theta = K V_e l H \quad (3)$$

and this formula shows that the resulting output is proportional to the magnetic field strength H. It is well known that by placing the device of FIG. 2 under a live conductor 10, the intensity of the induced magnetic field or the current that has induced it can be measured.

Lead glass has conventionally been used as a material that exhibits the Faraday effect (such material is hereinafter sometimes referred to as a Faraday material) to enable the measurement of an electrical current or magnetic field strength. This is mainly because lead glass has a relatively great Verdet constant (0.098 min/Oe.cm at a wavelength of 633 nm) and an inherently good temperature stability which is characteristic of diamagnetic glass. The Verdet constant of glass can be doubled by adding a metallic element (e.g. Tb), but the resulting glass is paramagnetic and its Verdet constant is an inverse function of the absolute temperature T.

Bismuth silicon oxide ($Bi_{12}SiO_{20}$ and hereinafter abbreviated as BSO), or bismuth germanium oxide ($Bi_{12}GeO_{20}$ and abbreviated as BGO), are Faraday materials that have a higher sensitivity than lead glass and which exhibit good temperature stability. They are effective in providing a magneto-optical converter having better characteristics.

In measurement of an electrical current using one of the Faraday materials listed above, the intensity of the induced magnetic field can be increased by confining it within a small space. The operating theory of this method is illustrated in FIG. 3, wherein a Faraday element 12 is positioned between the opposite ends of an annular iron core 11 around a conductor 10 and a beam of light from a light source is guided through an optical fiber 13, modulated by the magnetic field and thereafter directed to a photo detector through an optical fiber 14. Theoretically, this method is capable of measuring a current ranging from a few amperes to several thousand amperes, but since the magnetic field strength is decreased with the increasing distance between the opposing ends, most of the magnetooptical converters currently used are designed to intensify the magnetic field by minimizing the distance between the opposing ends of the iron core and at the same time cause the beam of light to travel within the Faraday material many times so as to increase the distance over which the magnetic field acts on the beam of light.

A typical arrangement conventionally used to achieve this object is depicted in FIG. 4. A beam of light from a light source is guided through an optical fiber 13 into a Faraday material 1 provided with reflecting layers 15 which is positioned between the opposing ends of an iron core 11. The plane of the light is linearly polarized by a polarizer 7 and is reflected many times within the Faraday material, the polarized light is passed through an analyzer 8 that detects the direction of polarization forming a 45° angle with respect to that of the polarization by the polarizer. The light is thereafter sent to a photo detector through an optical fiber 14. However, this arrangement has the following defects:

(1) The light does not travel over the entire distance between the opposing ends of the iron core, so the necessary sensitivity cannot be achieved without increasing the number of reflections occurring in the Faraday material;

(2) To increase the number of reflections the light must be introduced at an angle with respect to the surface of the Faraday material, and the desired amount of light picked up at the other end. Therefore, an exact adjustment of the angle of incidence is necessary but this is difficult and its difficulty is a function of the number of reflections.

SUMMARY OF THE INVENTION

Therefore, an object of the present invention is to provide a small and highly sensitive magneto-optical converter than can be constructed by a simple adjustment of the optical axis of the light entering and leaving the Faraday material.

The present invention provides a magneto-optical converter that uses polarizing beam splitters as a polarizer and an analyzer to cause a beam of light to leave the beam splitters at a right angle with respect to the angle of incidence. The present invention also provides a compact magneto-optical converter than can be fitted in a small space defined by the opposing ends of an iron core for intensifying a magnetic field because both the light receiving and exiting ends of the Faraday material are bevelled. As a further advantage, the present invention offers a magneto-optical converter that enables simple adjustment of the angle of incidence of light by positioning at least one optical rotator between the Faraday material and each of the polarizer and analyzer.

BRIEF DESCRIPTION OF THE DRAWINGS

FIGS. 6(a), and (b) are schematic representations of a second embodiment of the magneto-optical converter of the present invention.

FIGS. 7(a), and (b), are schematic representations of a third embodiment of the magneto-optical converter of the present invention.

DETAILED DESCRIPTION OF THE INVENTION

Figure 5A:
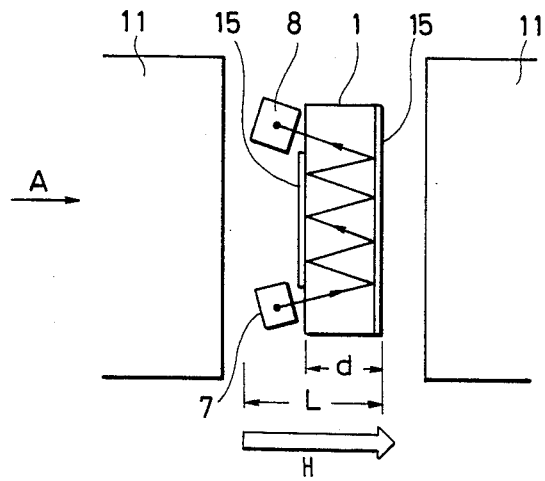
FIGS. 5(a), (b), and (c) are schematic representations of a preferred first embodiment of the magneto-optical converter of the present invention.
Figure 5B:
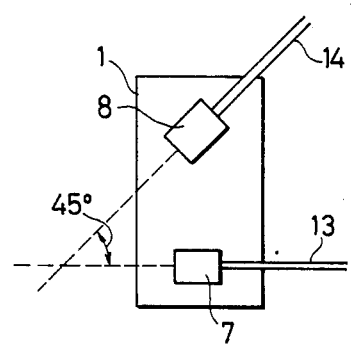
Figure 5C:
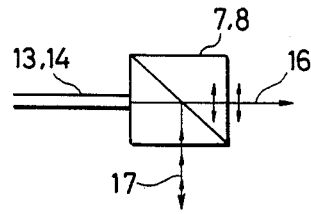

FIG. 5 shows a first embodiment of the magneto-optical converter of the present invention which achieves the necessary sensitivity with fewer reflections of light occuring within the Faraday material. As shown in FIG. 5(a), a beam of light enters and leaves the Faraday material at a right angle with respect to the direction of the lines of force of a magnetic field and as shown in FIG. 5(b) which is a view of the device from the left as indicated by arrow A, the polarizer and analyzer are so arranged that the relative angle of polarization is 45°. In this arrangement, the polarizing beam splitters (i.e. a polarizing prism and an analyzing prism) provide a beam of linearly polarized light 16 that travels straight in a direction parallel to the surface of the paper in FIG. 5(c) and they also present a beam of linearly polarized light 17 which is deflected downwardly in a direction perpendicular to the surface of the paper. The device of the present invention uses the second beam of light 17.

Figure 1:
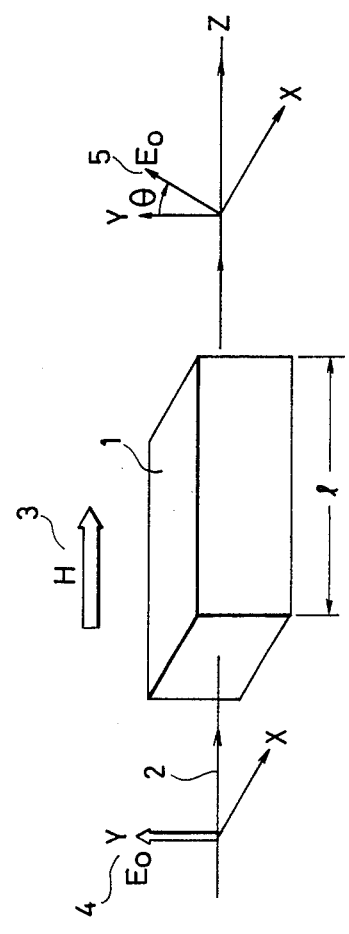
FIG. 1 is a schematic representation of the Faraday effect.
Figure 2:
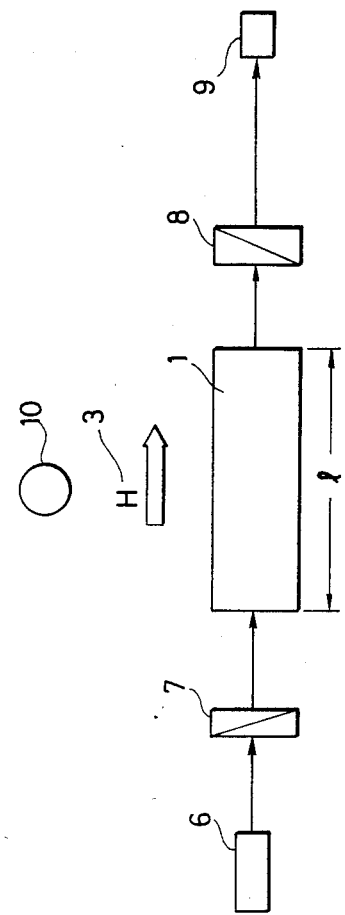
FIG. 2 is a block diagram of a method for measuring a magnetic field strength or an electrical current.
Figure 3:
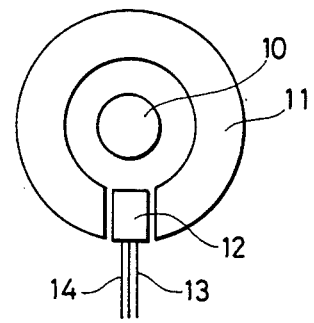
FIG. 3 is a schematic representation of a conventional method for intensifying a magnetic field.
Figure 4:
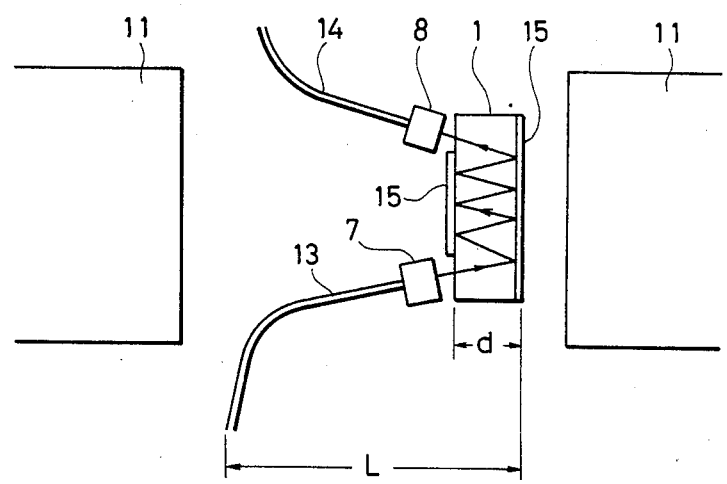
FIG. 4 is a schematic representation of a conventional magneto-optical converter.

The conventional system shown in FIG. 4 does not permit the use of sharply bent optical fibers, so with a Faraday material having a thickness of 3 mm and a polarizer and an analyzer both measuring 5 mm×5 mm×5 mm, the converter has a total length (L) of 4 or 5 cm and requires an iron core whose opposing ends are spaced apart by a corresponding distance. However, according to the system of the present invention shown in FIG. 5, the total length of the device can theoretically be reduced down to 8 mm. In an experiment conducted by the present inventors, the total length was not greater than 1 cm and the distance between the opposing ends of the iron core was from one fourth to one fifth of the currently feasible value thus providing a magneto-optical converter that uses the same Faraday material but which is 4 to 5 times more sensitive than the existing product.

A second embodiment of the present invention which enables simple adjustment of the optical axis of incident light is illustrated in FIG. 6. In the conventional device of FIG. 4 and the embodiment of FIG. 5 the polarizer 7 and the analyzer 8 must be positioned at an angle (from 10° to 20°) with respect to Faraday material 1 and this requires subsequent adjustment of the angle of incidence of light. But in the device of FIG. 6, both the light receiving and exiting ends of the Faraday material are bevelled, and the optical axis of the light leaving can be matched with that of the incident light simply by bonding the polarizer and analyzer onto the bevelled surfaces. It should be noted that the relative angle of polarization between the polarizer and an analyzer is 45° as shown in FIG. 6(b). The embodiment of FIG. 6 is particularly effective in setting up a magneto-optical converter in an exact manner within a short period of time. In an experiment conducted by the present inventors, about 10 hours were necessary for setting up a converter according to the arrangement of FIG. 4 and a substantial portion of this time was spent in matching optical axes. However, it took only about 5 hours to set up the device of FIG. 6.

A third embodiment of the present invention is depicted in FIG. 7 which further simplifies the matching of optical axes and provides an even smaller and easier-to-use device because of the parallel arrangement of the polarizer and analyzer. In the conventional system, it is inherently necessary to arrange a polarizer at an angle of 45° with respect to an analyzer in order to detect the modulation of optical intensity. However, as a result of various studies by the present inventors, it has been found that this arrangement becomes unnecessary if the direction of polarization of light is rotated by 45° by an optical rotator made of quartz or other crystals. To be more specific, by arranging a dextrorotator 18 and levorotator 19 as shown in FIG. 7(a) to provide a total angle of rotation of 45°, not only polarizer 7 and analyzer 8, but also the two optical fibers 13 and 14 may be arranged parallel to each other. Only a single rotator may be used if it provides an angle of rotation of 45°. But the angle of rotation is determined by the thickness of a rotator, so to reduce the overall length (L) of the converter the use of two rotators is preferred. The other requirement is that if two rotators are used, one of them should be a dextrorotator, whereas the other should be a levorotator. If the two rotators have the same rotational sense, they cancel each other's angle of rotation because the incident light travels in a direction opposite the leaving light. The embodiment of FIG. 7 permits an even simpler adjustment of optical axes and in an experiment conducted, a converter could be set up in only about 2 hours. In FIG. 7, both the light receiving and exiting ends of the Faraday material are bevelled, but the same result can be obtained by using a flat surfaced material and the relative angle of polarization of 45° between the polarizer and the analyzer can be eliminated by using optical rotators.

According to a further embodiment of the present invention, a magneto-optical converter having better temperature stability can be produced by using an optical rotator made of two or more crystalline materials. The angle of rotation is generally a function of temperature and quartz, the most common rotator, experiences an increase of about 7 percent when the temperature goes up by about 50° C. Therefore, even if the angle of rotation is set at 45° in the arrangement of FIG. 7, it fluctuates in response to varying temperatures, and this shifts the direction of polarization of light entering the analyzer after passing through the Faraday material. As a result, formula (2) becomes invalid and there occurs a change in the sensitivity of the converter. For operation at room temperature, quartz performs satisfactorily as an optical rotator to be incorporated in the system of FIG. 7. However, if the device is used under special circumstances such as in the outside of a power transforming plant or in the hotter part of a large current carrying conductor, the device is subject to a temperature drop down to 0° C. or lower in winter or to an increase up to 100° C. in summer due to direct sunshine and the flowing current. The resulting variation in temperature of ±50° C. will cause a detection error of several percent.

The present inventors have made various studies on a magneto-optical converter that is theramlly stable and holds its sensitivity variation within a range of ±0.5% which is the value normally required for instruments used to monitor power handling facilities, and have found that the angle of rotation of BSO and BGO is decreased with increasing temperatures. Therefore, according to a further embodiment of the present invention, one of the two rotators 18 and 19 is made of quartz and the other is made of BSO or BGO. The angle of rotation of BSO or BGO is about twice as temperature-dependent as quartz, and its absolute value is substantially nearly equal to that of quartz. Consequently, if quartz with an angle of rotation of 30° and BSO with an angle of rotation of 15° are used, they cancel each other in respect of the temperature dependency of the angle of rotation. To determine the advantage of the fourth embodiment of the present invention, we conducted a sensitivity test in a temperature range from 0° C. to 100° C. with a converter A that used only quartz as optical rotators and a converter B that used quartz in one rotator and BSO in the other. The result was that converter A experienced a sensitivity variation of ±2% but no variation could be detected for converter B within an accuracy of measurement of ±0.2%.

The present invention provides a magneto-optical converter of good characteristics that makes use of the inherent good temperature stability of a Faraday material such as lead glass, BSO or BGO. Other Faraday materials can also be used, for example, a single crystal of yttrium iron garnet ($Y_3Fe_5O_{12}$ or YIG) that exhibits a high degree of the Faraday effect on light having a wavelength longer than 1 μm can be used to make up a more sensitive and smaller converter.

As described in the foregoing, the magneto-optical converter of the present invention has the following advantages:

(1) high sensitivity due to the short length of the device and the small distance between the opposing ends of an iron core;

(2) easy matching of optical axes because both light receiving and exiting ends of a Faraday material are beveled;

(3) easy setting up of the device due to the use of optical rotators; and (4) increased stability of sensitivity against temperature variations on account of the use of both quartz and BSO or BGO as rotators.

What is claimed is:

1. A magneto-optical converter comprising a body of material exhibiting the Faraday effect, magnetic means having spaced apart ends with a magnetic field extending therebetween, said body being disposed between said ends and having a receiving end, an exiting end opposite the receiving end, and a pair of reflecting surfaces located on opposite sides of the body perpendicular to said magnetic field to increase the path length of light passing therethrough, a polarizer for directing a beam of light into a receiving end of said body of material, and an analyzer for picking up the light exiting from an exiting end of said body of material, said polarizer and said analyzer being polarizing beam splitters with said polarizer being arranged for directing a beam of polarized light in a direction perpendicular to the direction of an incident light beam whereby an incident light beam directed to said polarizer will be disposed perpendicular to said magnetic field and a light beam leaving said body and entering said analyzer will exit said analyzer perpendicular to said magnetic field.

2. A magneto-optical converter according to claim 1 wherein both the light receiving and exiting ends of said Faraday material are bevelled for engagement by said polarizer and said analyzer at the proper angle relative to each other.

3. A magneto-optical converter according to claim 1 wherein at least one optical rotator is positioned between said Faraday material and each of said polarizer and said analyzer.

4. A magneto-optical converter according to claim 1 wherein both the light receiving and exiting ends of said Faraday material are bevelled and at least one optical rotator is positioned between said Faraday material and each of said polarizer and said analyzer.

5. A magneto-optical converter according to claim 3 wherein one of said optical rotators is a dextrorotator and the other is a levorotator.

6. A magneto-optical converter according to claim 4 wherein one of said optical rotators is a dextrorotator and the other is a levorotator.

7. A magneto-optical converter according to claim 5 wherein one of said optical rotators is of quartz and the other is of bismuth silicon oxide ($B_{12}SiO_{20}$) or bismuth germanium oxide ($Bi_{12}GeO_{20}$).

8. A magneto-optical converter according to claim 6 wherein one of said optical rotators is of quartz and the other is of bismuth silicon oxide ($B_{12}SiO_{20}$) or bismuth germanium oxide ($Bi_{12}GeO_{20}$).

9. A magneto-optical converter according to claim 1 wherein said Faraday material is made of lead glass, bismuth silicon oxide or bismuth germanium oxide.

10. A magneto-optical converter according to claim 1 wherein said Faraday material is made of yttrium iron garnet ($Y_3Fe_5O_{12}$).

* * * * *